(12) United States Patent
Lee

(10) Patent No.: US 9,548,419 B2
(45) Date of Patent: Jan. 17, 2017

(54) LIGHT EMITTING DIODE CHIP HAVING MULTI MICROSTRUCTURE SUBSTRATE SURFACE

(71) Applicants: Southern Taiwan University of Science and Technology, Tainan (TW); EVERLIGHT ELECTRONICS CO., LTD., New Taipei (TW)

(72) Inventor: Ming-Lun Lee, Tainan (TW)

(73) Assignees: Southern Taiwan University of Science and Technology, Tainan (TW); EVERLIGHT ELECTRONICS CO., LTD., New Taipei (TW)

( * ) Notice: Subject to any disclaimer, the term of this patent is extended or adjusted under 35 U.S.C. 154(b) by 0 days.

(21) Appl. No.: 14/521,471

(22) Filed: Oct. 23, 2014

(65) Prior Publication Data

US 2015/0340558 A1    Nov. 26, 2015

(30) Foreign Application Priority Data

May 20, 2014  (TW) .............................. 103117640 A
May 20, 2014  (TW) .............................. 103208802 U

(51) Int. Cl.
| H01L 33/22 | (2010.01) |
| H01L 33/02 | (2010.01) |
| H01L 33/12 | (2010.01) |
| H01L 33/42 | (2010.01) |
| H01L 33/56 | (2010.01) |
| H01L 33/60 | (2010.01) |
| H01L 33/06 | (2010.01) |
| H01L 33/20 | (2010.01) |

(52) U.S. Cl.
CPC ............... *H01L 33/22* (2013.01); *H01L 33/06* (2013.01); *H01L 33/12* (2013.01); *H01L 33/20* (2013.01); *H01L 33/42* (2013.01); *H01L 33/56* (2013.01); *H01L 33/60* (2013.01)

(58) Field of Classification Search
CPC .... H01L 21/0259; H01L 29/122; H01L 33/22; H01L 51/5268
See application file for complete search history.

(56) References Cited

U.S. PATENT DOCUMENTS

| 6,072,117 A  * | 6/2000 | Matsuyama .... H01L 31/022466 |
| | | 136/256 |
| 6,091,085 A | 7/2000 | Lester |
| | (Continued) | |

FOREIGN PATENT DOCUMENTS

TW     M491255     12/2014

OTHER PUBLICATIONS

"Office Action of Taiwan Counterpart Application", issued on Dec. 14, 2015, p. 1-p. 8.

*Primary Examiner* — Ida M Soward
(74) *Attorney, Agent, or Firm* — Jianq Chyun IP Office

(57) ABSTRACT

A light emitting diode chip including a substrate and a light emitting diode element layer is provided. The substrate has a growth surface and a plurality of microstructures on the growth surface, wherein an area of the growth surface occupied by the microstructures is A1 and an area of the growth surface not occupied by the micro-structures is A2, wherein A1 and A2 satisfies the relation of $0.1 \leq A2/(A1+A2) \leq 0.5$. The light emitting diode element layer is disposed on the growth surface of the substrate.

24 Claims, 9 Drawing Sheets

(56) References Cited

U.S. PATENT DOCUMENTS

| | | | |
|---|---|---|---|
| 6,657,236 B1 | 12/2003 | Thibeault et al. | |
| 7,042,150 B2* | 5/2006 | Yasuda | H01L 21/0237 257/103 |
| 7,053,420 B2 | 5/2006 | Tadatomo et al. | |
| 7,129,019 B2* | 10/2006 | Kakuta | G11B 7/24 369/275.5 |
| 7,683,386 B2* | 3/2010 | Tanaka | H01L 21/0237 257/88 |
| 7,825,577 B2* | 11/2010 | Hsu | H01L 33/007 313/498 |
| 7,943,950 B2* | 5/2011 | Bechtel | H01L 33/22 257/98 |
| 7,977,695 B2* | 7/2011 | Shim | H01L 33/22 257/98 |
| 8,044,422 B2* | 10/2011 | Dai | H01L 33/20 257/431 |
| 8,957,433 B2* | 2/2015 | Sako | C30B 25/186 257/95 |
| 8,963,165 B2* | 2/2015 | Araki | H01L 21/0243 257/627 |
| 8,963,184 B2* | 2/2015 | Liao | F21K 9/50 257/91 |
| 9,123,623 B2* | 9/2015 | Jo | H01L 27/15 |
| 2005/0030881 A1* | 2/2005 | Endoh | G11B 7/007 369/275.4 |
| 2005/0219992 A1* | 10/2005 | Takeda | B29C 43/021 369/275.1 |
| 2006/0060888 A1* | 3/2006 | Kim | H01L 21/02378 257/200 |
| 2006/0226431 A1* | 10/2006 | Lee | H01L 33/22 257/79 |
| 2006/0267025 A1* | 11/2006 | Wuu | H01L 33/007 257/79 |
| 2008/0187678 A1* | 8/2008 | Fleming | B05D 1/60 427/488 |
| 2008/0277682 A1* | 11/2008 | Mishra | H01L 33/04 257/98 |
| 2009/0280597 A1* | 11/2009 | Wijekoon | H01L 21/30608 438/71 |
| 2010/0059789 A1* | 3/2010 | Choi | H01L 21/0242 257/103 |
| 2010/0154477 A1* | 6/2010 | Thomsen | C03B 13/08 65/93 |
| 2010/0207155 A1* | 8/2010 | Cho | H01L 33/10 257/98 |
| 2011/0204412 A1* | 8/2011 | Sugano | H01L 33/0095 257/103 |
| 2012/0086037 A1* | 4/2012 | Kim | H01L 33/405 257/98 |
| 2012/0155093 A1* | 6/2012 | Yamada | H01L 51/5275 362/311.01 |
| 2012/0156814 A1* | 6/2012 | Hsieh | G03F 1/34 438/29 |
| 2013/0015487 A1* | 1/2013 | Okuno | H01L 33/20 257/98 |
| 2013/0022773 A1* | 1/2013 | Aida | C30B 25/18 428/64.1 |
| 2014/0124805 A1* | 5/2014 | Minato | H01L 33/10 257/95 |
| 2014/0131732 A1* | 5/2014 | Fu | H01L 33/12 257/76 |
| 2015/0034959 A1* | 2/2015 | Chen | H01L 21/0243 257/76 |
| 2015/0076505 A1* | 3/2015 | Ke | H01L 33/22 257/76 |
| 2016/0043282 A1* | 2/2016 | Chae | H01L 33/22 257/98 |
| 2016/0056352 A1* | 2/2016 | Koike | H01L 33/22 257/98 |

* cited by examiner

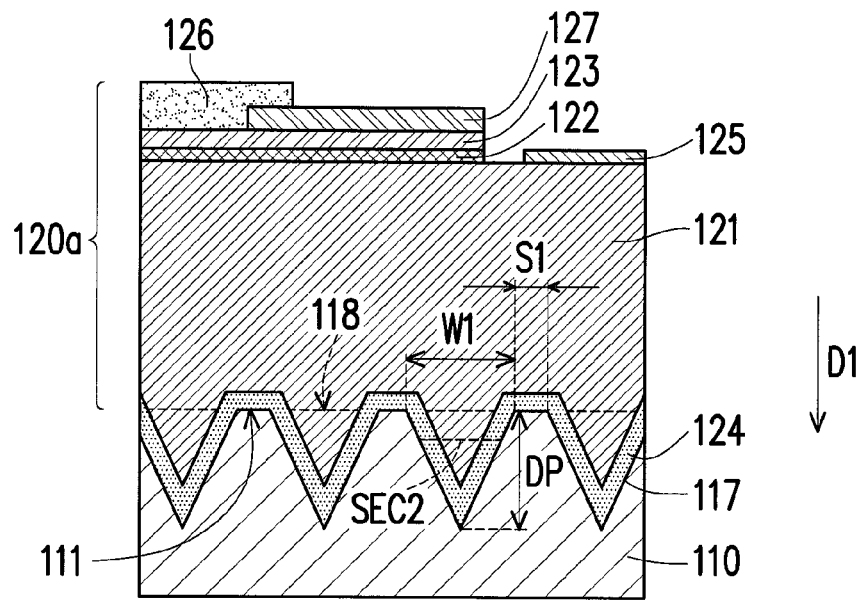
FIG. 12     100F
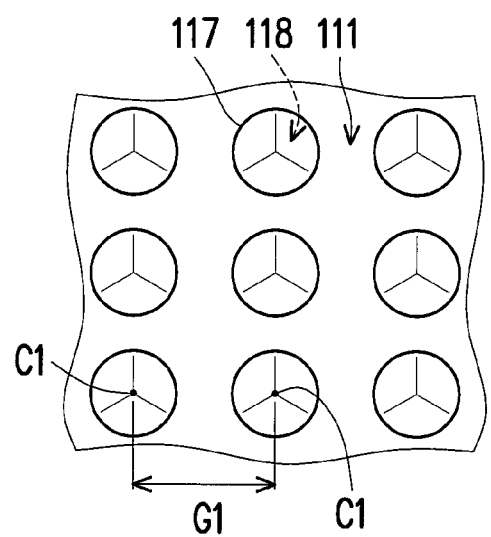
FIG. 13

LIGHT EMITTING DIODE CHIP HAVING MULTI MICROSTRUCTURE SUBSTRATE SURFACE

CROSS-REFERENCE TO RELATED APPLICATION

This application claims the priority benefits of Taiwan application serial no. 103117640, filed on May 20, 2014, and Taiwan application serial no. 103208802, filed on May 20, 2014. The entirety of each of the above-mentioned patent applications is hereby incorporated by reference herein and made a part of this specification.

TECHNICAL FIELD

The disclosure relates to a light emitting diode chip and more particularly to a light emitting diode chip with favorable light extraction efficiency.

BACKGROUND

Along with the advancement of the semiconductor technology, light emitting diodes now have the advantages of high brightness output, low power consumption, compactness, low driving voltage, mercury free. Therefore, the LED has been extensively applied in the field of displays and illumination.

A light emitting diode structure includes a light emitting diode chip and a peripheral wiring, wherein the light emitting diode chip includes a growth substrate and a semiconductor element layer. In general, the light emitting efficiency and the light extraction efficiency of a light emitting diode chip are related.

Currently, the light emitting efficiency is enhanced by improving the light extracting efficiency of the semiconductor element layer according to the existing techniques. For example, U.S. Pat. No. 7,053,420 discloses forming concaves and convexes on a growth substrate to increase the probability of light scattering and U.S. Pat. No. 6,091,085 discloses the increase the probability of light scattering via the formation of protrusions and depressions on the growth substrate. Apparently, to elevate the light efficiency is the attention focus and the research subject for researchers and the industry.

SUMMARY

An exemplary embodiment of the disclosure provides a light emitting diode chip that offers favorable light extraction efficiency.

An exemplary embodiment of the disclosure provides a light emitting diode emitting diode chip that includes a substrate and a light emitting diode element layer. The substrate includes a growth surface and a plurality of microstructures located on the growth surface, wherein the area of the growth surface occupied by these microstructures is A1 and the area of the growth surface not occupied by these microstructures is A2, and A1 and A2 satisfy the relation: $0.1 \leq A2/(A1+A2) \leq 0.5$. The light emitting element layer is disposed on the growth surface of the substrate.

According to an exemplary embodiment of the disclosure, wherein the plurality of microstructures includes a plurality of protrusions.

According to an exemplary embodiment of the disclosure, wherein the height of each protrusion is between 1 micron and 3 microns.

According to an exemplary embodiment of the disclosure, wherein the height of each protrusion is between 1.2 micron and 2 microns.

According to an exemplary embodiment of the disclosure, wherein each protrusion has a base connecting with the growth surface and the base has a width, and two neighboring bases maintain a distance therebetween, and a sum of the width and the distance is between 1 micron and 3 microns.

According to an exemplary embodiment of the disclosure, wherein the distance between the centroids of two neighboring bases is between 1 micron and 3 microns.

According to an exemplary embodiment of the disclosure, each protrusion of has a plurality of sectional surfaces parallel to the growth surface, and the areas of the plurality of sectional surfaces progressively decrease along the height direction of the protrusion.

According to an exemplary embodiment of the disclosure, the areas of the plurality of sectional surfaces linearly decrease along the height direction of each protrusion.

According to an exemplary embodiment of the disclosure, the areas of the plurality of sectional surfaces decrease non-linearly along the height direction of each protrusion.

According to an exemplary embodiment of the disclosure, the plurality of microstructures includes a plurality of depressions.

According to an exemplary embodiment of the disclosure, the depth of each depression is between 1 micron and 3 microns.

According to an exemplary embodiment of the disclosure, the depth of each depression is between 1.2 micron and 2 microns.

According to an exemplary embodiment of the disclosure, each depression has an opening connecting with the growth surface and the opening has a width. The two neighboring openings maintain a distance therebetween, and a sum of the width and the distance is between 1 micron and 3 microns.

According to an exemplary embodiment of the disclosure, the distance between the centroids of the two neighboring openings is between 1 micron and 3 microns.

According to an exemplary embodiment of the disclosure, each depression has a plurality of sectional surfaces parallel to the growth surface, and areas of the plurality of sectional surfaces progressively decrease along a depth direction of the depression.

According to an exemplary embodiment of the disclosure, the areas of the plurality of sectional surfaces linearly decrease along the height direction of the depression.

According to an exemplary embodiment of the disclosure, the above light emitting diode element layer further includes a first conductivity type semiconductor layer, a light emitting layer and a second conductivity type semiconductor layer. The first conductivity type semiconductor layer is disposed on the growth surface. The light emitting layer is disposed on the first conductivity type semiconductor layer. The second conductivity type semiconductor layer is disposed on the light emitting layer.

According to an exemplary embodiment of the disclosure, the above light emitting diode element layer further includes a buffer layer disposed on the growth surface. The buffer layer is configured between the substrate and the first conductivity type semiconductor layer and encapsulates the plurality of protrusions.

According to an exemplary embodiment of the disclosure, a material of the above buffer layer includes, but is not limited to, aluminum nitride, gallium nitride, indium nitride, aluminum indium nitride, aluminum gallium nitride, aluminum gallium indium nitride, zirconium boride, or hafnium nitride.

According to an exemplary embodiment of the disclosure, one of the first conductivity type semiconductor layer and the second conductivity type semiconductor layer is a P-type semiconductor layer and another one of the first conductivity type semiconductor layer and the second conductivity type semiconductor layer is an N-type semiconductor layer.

According to an exemplary embodiment of the disclosure, the light emitting diode element layer further includes a first electrode electrically connected with the first conductivity type semiconductor layer and a second electrode electrically connected with the second conductivity type semiconductor layer.

According to an exemplary embodiment of the disclosure, the light emitting diode element layer further includes a transparent conductive layer disposed on the second conductivity type semiconductor layer, and the second electrode is electrically connected with the second conductivity type conductor layer through the transparent conductive layer.

According to an exemplary embodiment of the disclosure, the light emitting diode element layer further includes a reflective layer, disposed on the transparent conductive layer, and the transparent conductive layer is disposed between the reflective layer and the second conductivity type conductive layer.

According to an exemplary embodiment of the disclosure, the light emitting diode layer comprises a single quantum well structure or a multiple quantum well structure.

According to an exemplary embodiment of the disclosure, the surface roughness of the surface of the microstructure and the grow surface does not exceed 10 nanometers.

According to the exemplary embodiments of the disclosure, the growth surface of the substrate of the light emitting diode chip has a plurality of microstructures thereon, wherein the ratio of the area of the growth surface not covered by these microstructures to the total area of the growth surface is between 0.1 and 0.5. Accordingly, the probability that the light being scattered is increased to further improve the light extraction efficiency of the light emitting diode chip.

Several exemplary embodiments are described in detail below to further describe the disclosure.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 12 is a schematic diagram of a light emitting diode chip of another exemplary embodiment of the disclosure.

FIG. 13 is a partial top view diagram of a growth substrate in FIG. 12.

DETAILED DESCRIPTION OF DISCLOSED EXEMPLARY EMBODIMENTS

Figure 1:
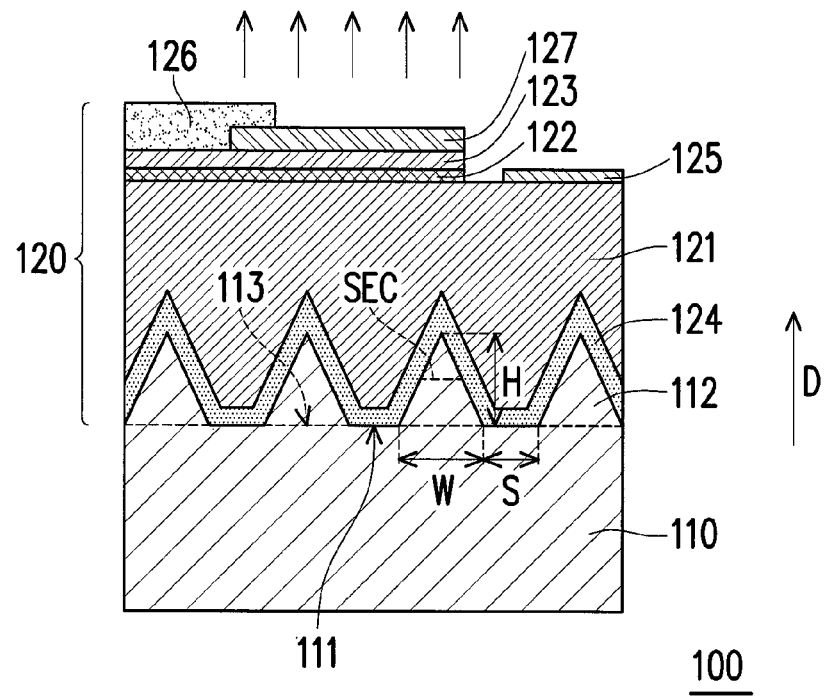
FIG. 1 is a schematic diagram of a light emitting diode chip according to an exemplary embodiment of the disclosure.

FIG. 1 is a schematic diagram of a light emitting diode chip according to an exemplary embodiment of the disclosure. Referring to FIG. 1, the light emitting diode chip 100 of the disclosure includes a substrate 110 and a light emitting diode element layer 120. In general, the substrate 110 may be sapphire (aluminum oxide $Al_2O_3$) substrate, silicon carbide (SiC) substrate, silicon (Si) substrate, gallium arsenide (GaAs) substrate, gallium phosphide (GaP) substrate, gallium nitride (GaN) substrate, lithium aluminum oxide ($LiAlO_2$) substrate or other substrate that is appropriate for epitaxy.

The substrate 110, constructed with the above material for example and having a growth surface 111 and a plurality of microstructures configuring at the growth surface 111, is formed via a patterning process, wherein these microstructures are protrusions 112, for example. Typically, the patterning of the substrate 110 is achieved by photolithograph and etching process. More particularly, a photoresist is used to define the pattern to be transferred to the substrate 110, followed removing a portion of the substrate 110 through a dry etching or wet etching process to form the protrusions 112 on the substrate 110 surface. It should be understood that the patterning of the substrate 110 is presented by way of examples and not by way of limitation. In other exemplary embodiments, a surface treatment is performed to render the surface of each protrusion 112 and the growth surface 111 with an appropriate degree of roughness. In principle, the surface roughness of the surface of each protrusion 112 and the growth surface 111 does not exceed the roughness value of 10 nm. When the surface roughness of the surface of each protrusion 112 and the growth surface does not exceed 10 nm, the epitaxy quality of the light emitting diode element layer 120 is improved to ensure the light emitting efficiency of the light emitting diode chip 100.

In this exemplary embodiment, the height H of each protrusion 112 is between 1 micron and 3 microns. In another exemplary embodiment, the height is between 1.2 micron and 2 microns. When the heights H of each protrusion 112 is too high, epitaxy of the light emitting diode element layers may be difficult. When the height H of each protrusion 112 is too high, an adverse light extracting efficiency of the photon is resulted. Moreover, the thickness of the substrate 110 is between about 50 microns and about 500 microns. The thickness of the substrate 110 herein does not include the height of each protrusion 112.

Still referring to FIG. 1, the light emitting diode element layer 120 is disposed on the growth surface 111 of the substrate 110. In this exemplary embodiment, the light emitting diode element layer 120 includes a first conductivity type semiconductor layer 121, a light emitting layer 122 and a second semiconductor layer 123, wherein the first conductivity type semiconductor layer 121 is disposed on the growth surface 111, the light emitting layer 122 is disposed on the first conductivity type semiconductor layer 121 and the second conductivity type semiconductor layer 123 is disposed on the light emitting layer 122. Typically, the first conductivity type semiconductor layer 121, and the light emitting layer 122 and the second conductivity type semiconductor layer 123 are fabricated by metal organic chemical vapor deposition (MOCVD); however, it should be understood that the fabrication method of the above layers is presented by way of examples and not by way of limitation.

Further, one of the first conductivity type semiconductor layer 121 and the second conductivity type semiconductor layer 123 is a P-type semiconductor layer, while another one of the first conductivity type semiconductor layer 121 and the second conductivity type semiconductor layer 123 is an N-type semiconductor layer. In this exemplary embodiment, the first conductivity type semiconductor layer 121 is an N-type gallium nitride layer doped with silicon, germanium, antimony or a combination thereof, while the second conductivity type semiconductor layer 12 is a P-type gallium nitride layer doped with magnesium. Further, the thickness of the first conductivity type semiconductor layer 121 is between about 2 microns and 6 microns, while the thickness of the second conductivity type semiconductor layer 123 is between about 0.1 micron and 0.5 micron.

In one exemplary embodiment, the light emitting layer 122 is constructed with, for example, a single or multiple quantum well structure of aluminum gallium indium nitride, wherein the thickness of the light emitting layer 122 is between about 0.05 micron and 0.3 micron. Moreover, the light emitting diode element layer 120 also includes a buffer layer 124, a first electrode 125, a second electrode 126 and a transparent conductive layer 127. The buffer layer 124 is disposed on the growth surface 111 and is configured between the substrate 110 and the first conductivity type semiconductor layer 121 for mitigating the lattice mismatch phenomenon resulted from the disparity in the lattice constants between the first conductivity type semiconductor layer 121 and the substrate 110. The buffer layer 124 improves the epitaxy quality of the first conductivity type semiconductor layer 121, the light emitting layer 122 and the second conductivity type semiconductor layer 123; hence, the light extraction efficiency of the light emitting diode chip 100 is precluded from being affected.

In this exemplary embodiment, the protrusions 112 configured on the growth surface 111 are encapsulated by the buffer layer 124, wherein the thickness of the buffer layer 124 is between about 0.01 micron and 0.1 micron. Typically, the material of the buffer layer 124 includes, but is not limited to, aluminum nitride, gallium nitride, indium nitride, aluminum indium nitride, aluminum gallium nitride, aluminum gallium indium nitride, zirconium boride, or hafnium nitride.

Further, the first electrode 125 is disposed on and is electrically connected with the first conductivity type semiconductor layer 121. The second electrode 126 and the transparent conductive layer 127 are both disposed on and are electrically connected with the second conductivity type semiconductor layer 123, wherein the second electrode 126, for example, is electrically connected with the second conductivity type semiconductor layer 123 through the transparent conductive layer 127. In general, the first electrode 125 and the second electrode 126 are constructed with a metal having good electrical conductivity, such as gold, aluminum or silver or an alloy thereof. Further, the material of the transparent conductive layer 127 is, for example, a single layer or multiple layers of metal with an overall thickness being less than 0.03 micron. Also, metal oxide, for example, indium tin oxide (ITO) or indium zinc oxide (IZO), may also be selected for the material of the transparent conductive layer 127, wherein the thickness of the transparent conductive layer 127 formed with metal oxide is between 0.03 micron and 0.3 micron.

Figure 2:
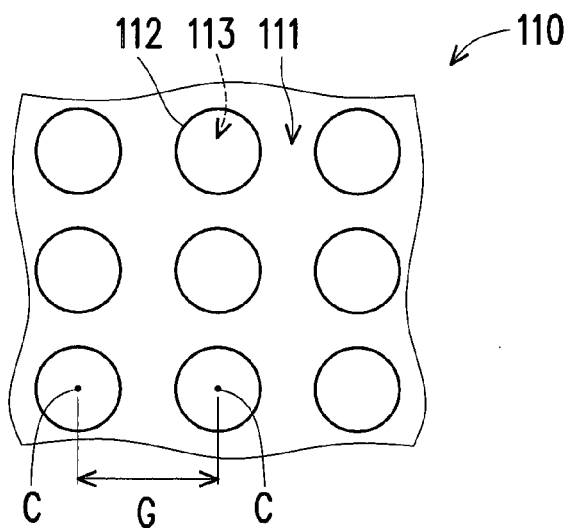
FIG. 2 is a partial top view of a growth substrate of FIG. 1.

FIG. 2 is a partial top view diagram of the growth substrate of FIG. 1. Referring to both FIGS. 1 and 2, the area of the growth surface 111 occupied by the protrusions 112 is A1 and the area of the growth surface not occupied by the protrusions 112 is A2, wherein A1, A2 satisfy the following relation: $0.1 \leq A2/(A1+A2) \leq 0.5$, and $A2/(A1+A2)$ is defined as the filling ratio.

More specifically, each protrusion 112 has a base 113 connecting with the growth surface 111, and the base 113 has a width W. Herein, each protrusion 112 has a plurality of sectional surfaces SEC (one of which is schematically depicted in FIG. 1) parallel to the growth surface 111, wherein the areas of the sectional surfaces SEC progressively decreases, for example linearly decreases from the base 113, along the height direction D. In this exemplary embodiment, each protrusion 112 has, for example, a cone shape, with a circular base 113, and the diameter of the base is the width W. It should be noted that the application is not limited as such. In other exemplary embodiments, the base of the protrusions 112 may have other shapes, for example, oval, triangular, rectangular or polygonal, which can be attuned according to the actual design requirements.

A distance S is maintained between two neighboring bases 113, and the sum of the width W and the distance S is a fixed value, ranging between 1 micron and 3 microns. The following disclosure is exemplified by the sum of the width W and the distance S being 3 microns. The sum of the width W and the distance S is substantially identical to the distance G between the centroids C of two neighboring bases 113. Since the sum of the width W and the distance S is a fixed value, changes in the width W and the distance S affect the value of the filling ratio (which is $A2/(A1+A2)$). Alternatively speaking, when the width W increases, the distance S correspondingly decreases. Consequently, the area of the growth surface 111 occupied by the protrusions 112 increases and the area of the growth surface 111 not occupied by the protrusions 112 decreases to reduce the filling ratio. As the filling ratio becomes smaller, the light emitted from the light emitting layer 122 is effectively scattered by these protrusions 112; hence, the probability of photons encountering a totally internal reflection (TIR) inside the light emitting diode chip 112 is lower to thereby enhance the light extraction efficiency of the light emitting diode chip 100.

Figure 3:
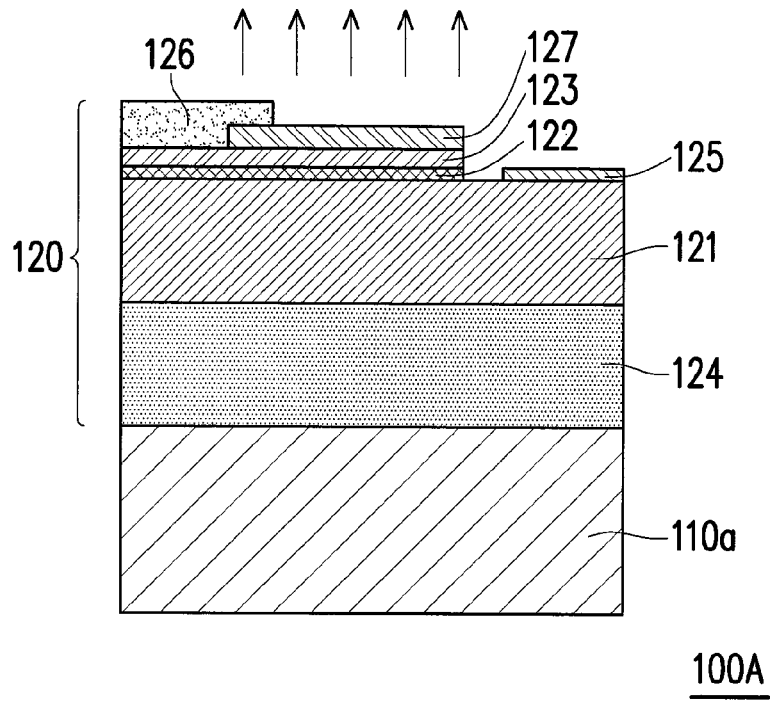
FIG. 3 is schematic diagram of a light emitting diode chip of a comparative example of the disclosure.

FIG. 3 is a schematic diagram of a light emitting diode chip of a comparative example of the disclosure. Referring to FIG. 3, the light emitting diode chip 100A in a comparative example and the previously disclosed light emitting diode chip 100 are substantially the same, the major difference between the two lies in that the light emitting diode chip 100A does not have a patterned surface on the substrate 110a; instead, the light emitting diode chip 100A has a planar surface. A comparison in the light extraction efficiency between the light emitting diode chip 100A and the light emitting diode chip 100 is described hereafter. The output power of the light emitted by the light emitting diode chip 100 is P and the output power of the light emitted by the light emitting diode chip 100A is P1. The equation used in calculating the enhancement of the output power of the light emitting chip 100 is (P−P1)/P1.

The light extraction efficiency test of the light emitting chip 100 is conducted based on four groups of parameters, wherein the filling ratio corresponding to the width W and the distance S of each group is tabulated in Table 1. According to the above disclosure, as the width W increases, the distance S and the filling ratio correspondingly decrease.

|  | 1$^{st}$ Group | 2$^{nd}$ Group | 3$^{rd}$ Group | 4$^{th}$ Group |
|---|---|---|---|---|
| Distance S (μm) | 0.1 | 0.3 | 0.5 | 0.7 |
| Width W(μm) | 2.9 | 2.7 | 2.5 | 2.3 |
| Filling Ratio (%) | 18% | 29% | 39% | 48% |

Figure 4:
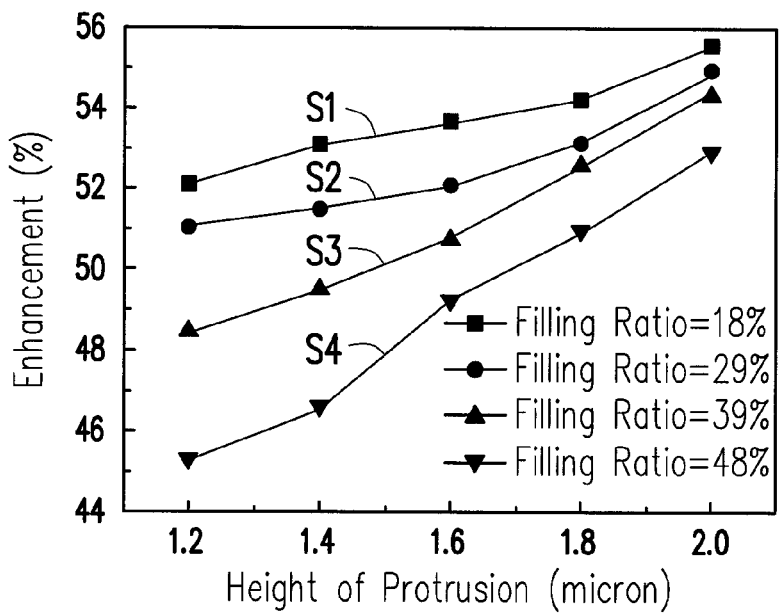
FIG. 4 is a diagram illustrating the test result of the light extraction efficiency of the light emitting diode chip of FIG. 1.

FIG. 4 is a diagram illustrating the test result of the light extraction efficiency of the light emitting diode chip of FIG. 1, wherein the vertical axis represents enhancement, while the horizontal axis represents the heights H of the protrusions 112. Referring to FIG. 4, lines S1 to S4 respectively represent the enhancement of light extraction efficiency of the light emitting diode chip 100 under the first to the fourth group of parameter settings. Under the conditions that A1 and A2 satisfying the relation of $0.1 \leq A2/(A1+A2) \leq 0.5$, the light extraction efficiency of the light emitting diode chip 100 is effectively enhanced, wherein the enhancement of the output power of the light emitting diode chip 100 is even more apparent when the filling ratio is 18%. The enhancement of the output power under the same group of parameter settings, in which the width W and the distance S are fixed such that the area A1 of the growth surface occupied by these protrusions 112 and the area A2 of the growth surface not occupied by these protrusions 112 remain unchanged, will be described herein with reference to the filling ratio of 18%. The test is conducted by varying the heights H (1.2 μm, 1.6 μm, 1.8 μm and 2.0 μm) of the protrusions. When the heights H of the protrusions 112 range between 1.2 μm and 2.0 μm, the enhancement of the output power of the light emitting diode chip 100 correspondingly increases as the heights H increase.

Reference will now be made in detail to other embodiments of the application. Whenever possible, components that are the same as or similar to those of the previous embodiment are assigned with the same reference numerals, and descriptions thereof will be omitted hereinafter.

Figure 5:
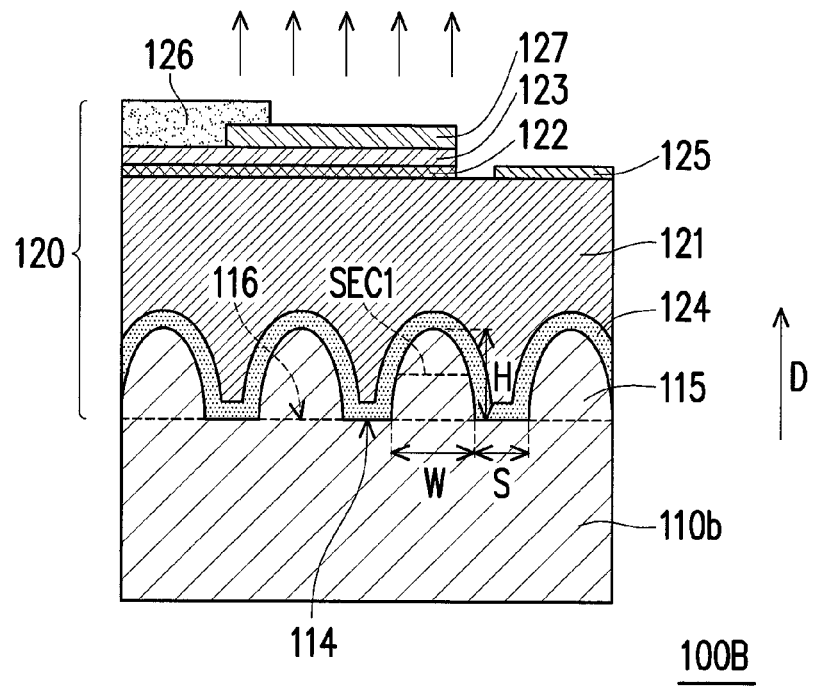
FIG. 5 is a schematic diagram of a light emitting diode chip of another exemplary embodiment of the disclosure.
Figure 6:
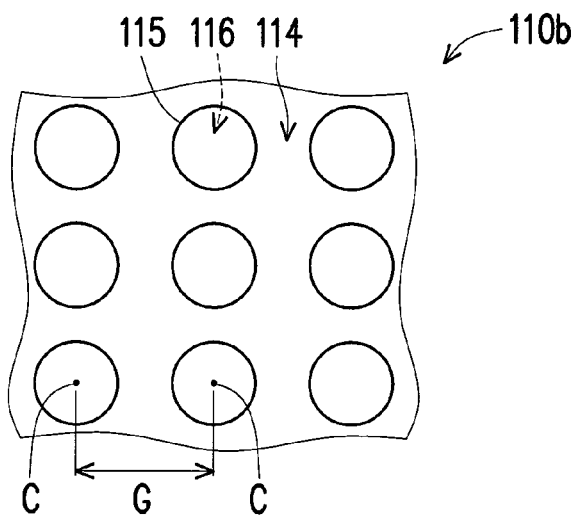
FIG. 6 is a partial top view diagram of the growth substrate of FIG. 5.

FIG. 5 is a schematic diagram of a light emitting diode chip of another exemplary embodiment of the disclosure. FIG. 6 is a partial top view diagram of the growth substrate of FIG. 5. Referring to both FIGS. 5 and 6, the light emitting diode chip 100b and the light emitting diode chip 100 are substantially the same. A major difference between the two lies in that the protrusions 115 on the growth surface 114 of the substrate 110b are not cone-shaped, but closer to bullet-like shaped. Alternatively speaking, the areas of the sectional surfaces SEC of each protrusion 115 (one of which is schematically depicted in FIG. 5) do not linearly decrease along the height direction. Alternatively speaking, the decreasing rate of the areas of the sectional surfaces SEC1 of each protrusion 115 increases as the height increases. In this exemplary embodiment, the base 116 of each protrusion 115 is circular, for example, and the width W is basically the diameter of the base 116. However, it should be understood that the application is not limited to any of the exemplary embodiments, and various modifications or alterations may be made without departing from the spirit of the invention. In other exemplary embodiments, the shape of the protrusion base can be oval, rectangular or polygonal, and be modified based on actual design requirements.

Figure 7:
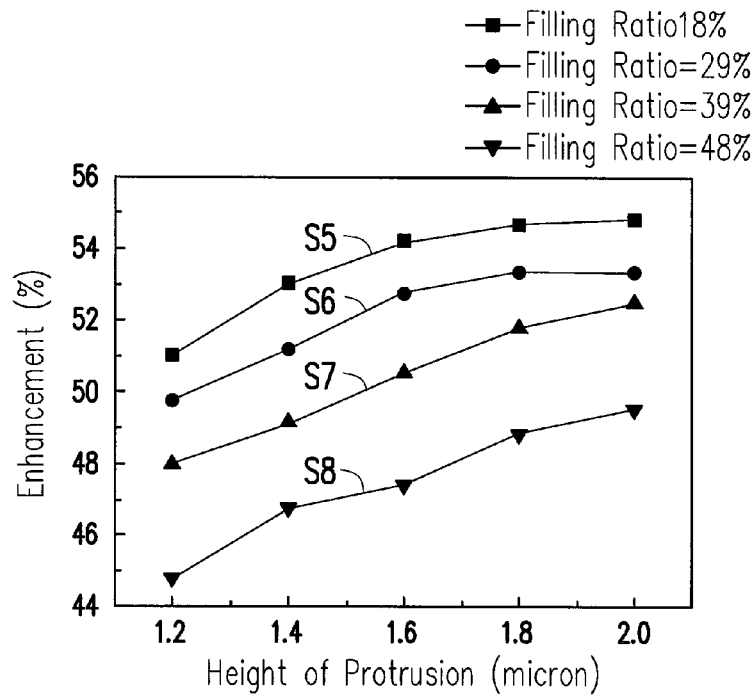
FIG. 7 is a diagram illustrating the test result of the light extraction efficiency of the light emitting diode chip of FIG. 5.

FIG. 7 is a diagram illustrating the test result of the light extraction efficiency of the light emitting diode chip of FIG. 5, wherein the vertical axis represents the enhancement, while the horizontal axis represents the heights H of the protrusions 115. Referring to FIG. 7, the light extraction efficiency of the light emitting diode chip 100B is compared with the light extraction efficiency of the light emitting diode chip 100A, wherein the parameter settings, the test method and enhancement calculation method can be referred to the previous embodiments, and the descriptions thereof are omitted hereinafter.

The lines S5 to S8 represent the enhancement of the output power of the light emitting diode chip 100B respectively under the first to the fourth parameter settings. More specifically, under the conditions that A1 and A2 satisfy the relation of $0.1 \leq A2/(A1+A2) \leq 0.5$, the light extraction efficiency of the light emitting diode chip 100B is effectively enhanced, wherein the enhancement of the output power of the light emitting diode chip 100B is most apparent when the filling ratio is 18%. The enhancement of the output power under the same group of parameter settings, meaning that the width W and the distance S are fixed such that the area A1 of the growth surface occupied by these protrusions 112 and the area A2 of the growth surface not occupied by these protrusions 112 remain unchanged, will be detailed herein with reference to the filling ratio of 18%. The test is conducted by varying the heights H (1.2 μm, 1.6 μm, 1.8 μm and 2.0 μm) of the protrusions. When the heights H of the protrusions 112 ranges between 1.2 μm and 2.0 μm, the enhancement of the output power of the light emitting diode chip 100B correspondingly increases as the heights H increase.

Figure 8:
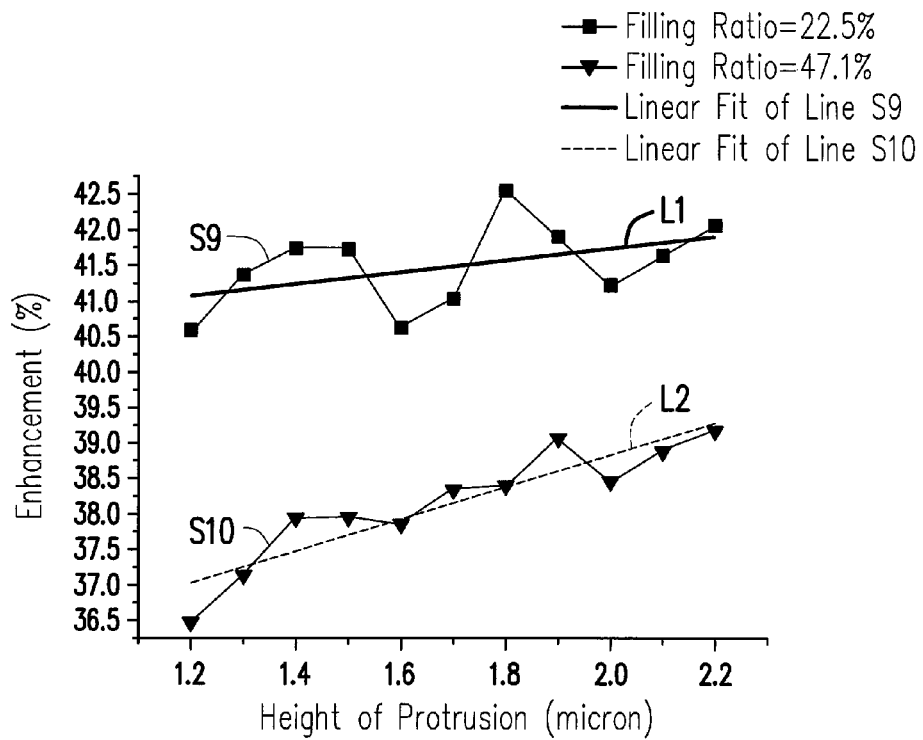
FIG. 8 is a diagram illustrating another test result of the light extraction efficiency of the light emitting diode chip of FIG. 5.

FIG. 8 a diagram illustrating another test result of the light extraction efficiency of the light emitting diode chip of FIG. 5, wherein the vertical axis represents enhancement, while the horizontal axis represents the heights H of the protrusions 115. Referring to FIG. 8, the test of light extraction efficiency of the light emitting diode chip 100B is performed respectively based on two groups of parameter settings. The first group parameter settings is that the width of the base 116 of each protrusion 115 is fixed at 2.5 microns, the distance S is fixed at 0.1 micron and the filling ratio is 22.5%. The second group parameter settings is that the width of the base 116 of the protrusion 115 is fixed at 2.5 micron, the distance S is fixed at 0.7 micron and the filling ratio is 47.1%.

Under the premise that the width W is fixed and the distance S gradually reduces, the number of protrusions 115 increases correspondingly; hence, the number of protrusions 115 under the first group of parameter settings is greater than the number of protrusions 115 under the second group of parameter settings. Alternatively speaking, under the first group of parameter settings, the area of the growth surface 111b occupied by these protrusions 115 increases, while the area of the growth surface 111b not occupied by these protrusions 115 decreases to reduce the filling ratio.

The lines S9, S10 represent the enhancement of the output power of the light emitting diode chip 100B respectively under the first group of parameter settings and the second group of parameter settings, wherein the heights of the protrusions is adjusted from 1.2 µm to 2.2 µm. The lines L1, L2 respectively represent the liner fit of the lines S9, S10. As shown in FIG. 8, as the filling ratio becomes smaller, the heights H of the protrusions 115 increase and the enhancement of the output power of the light emitting diode 100B is substantially reflected from the inclining trend.

The lights emitted from the light emitting diode chip 100, 100B and the light emitting diode chip 100A of the comparative example are actually emitted to the outside through the transparent conductive layer 127. In comparison, the light emitted from a flip-chip LED chip is emitted to the outside through a substrate. Based on the similar design principle of the above exemplary embodiments, favorable light extraction efficiency is achieved if the growth surface of the flip-chip LED chip substrate also comprises a plurality of protrusions, which is exemplified by the following embodiments. Whenever possible, components that are the same as those of the previous embodiment are assigned with the same reference numerals, and descriptions thereof will be omitted hereinafter.

Figure 9:
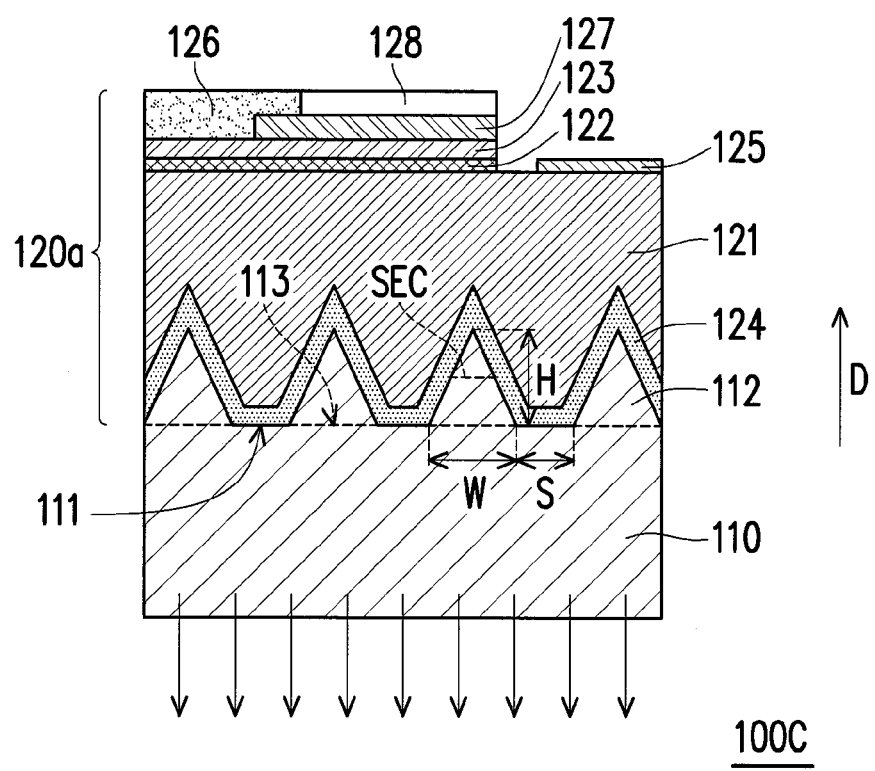
FIG. 9 is a schematic diagram of a light emitting diode chip according to another exemplary embodiment of the disclosure.

FIG. 9 is a schematic diagram of a light emitting diode chip according to another exemplary embodiment of the disclosure. Referring to FIG. 9, the light emitting diode chip 100C is, for example, a flip-chip LED chip, and is substantially the same as the light emitting diode chip 100. A major difference between the two lies in that the light of the light emitting diode chip 100C is emitted in a direction such that the light passes to the outside substantially through the substrate 110. Accordingly, in this exemplary embodiment, the light emitting diode element layer 120a further includes a reflective layer 128. The reflective layer 128 is disposed on the transparent conductive layer 127, and the transparent conductive layer 127 is positioned between the reflective layer 128 and the second conductivity type semiconductor layer 123. Generally speaking, the material of the reflective layer 128 may include silver, aluminum, or other metals with desired reflective property. When the light emitted from the light emitting layer 122 is irradiated to the reflective layer 128, the light is reflected and then transmitted toward the substrate 110.

Figure 10:
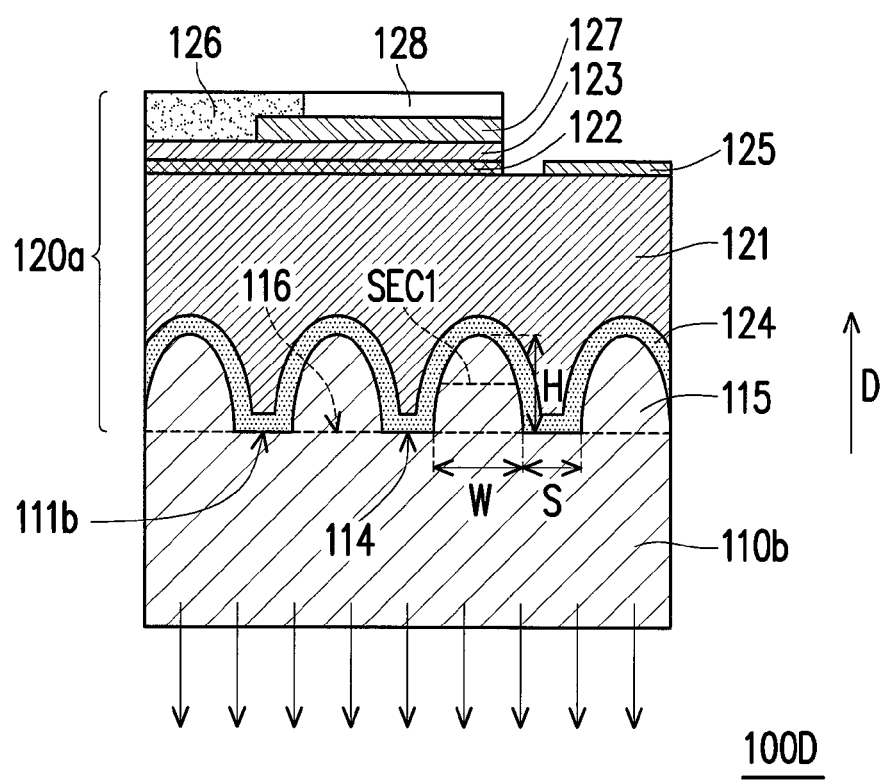
FIG. 10 is a schematic diagram of a light emitting diode chip according to another exemplary embodiment of the disclosure.

FIG. 10 is a schematic diagram of a light emitting diode chip according to another exemplary embodiment of the disclosure. Referring to FIG. 10, the light emitting diode chip 100D and the light emitting diode chip 100C are substantially the same. A major difference between the two lies in that the protrusions 115 on the growth surface 114 of the substrate 110b are not cone-shaped, but closer to bullet-like shaped.

Figure 11:
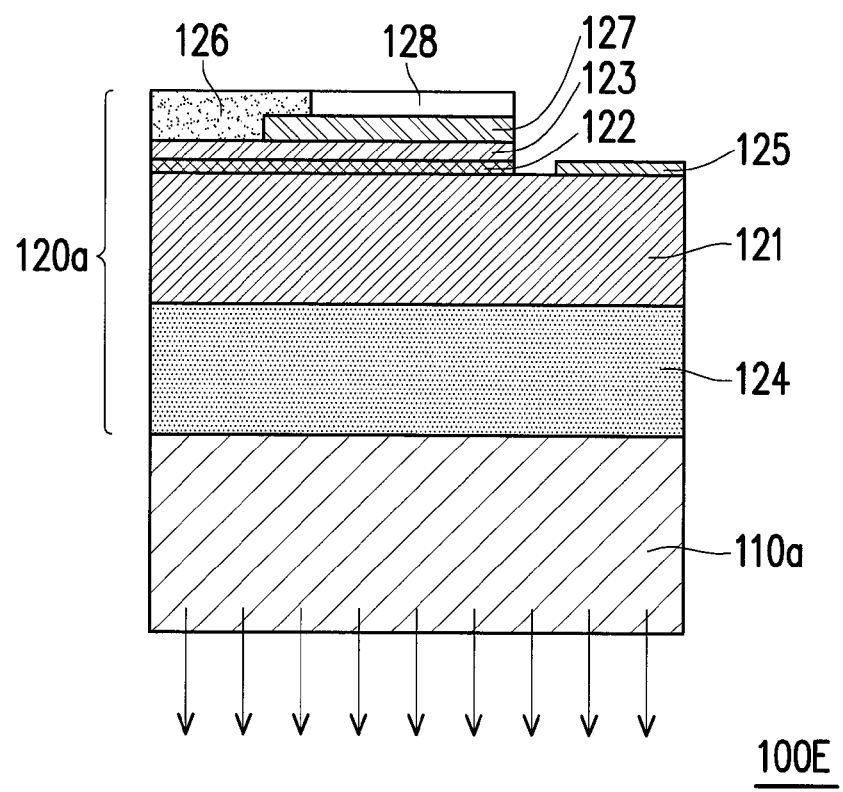
FIG. 11 is a schematic diagram of a light emitting diode chip of another comparative example of the disclosure.

FIG. 11 is a schematic diagram of a light emitting diode chip of another comparative example of the disclosure. Referring to FIG. 11, the light emitting diode chip 100E and the light emitting diode chip 100C are substantially the same; a major difference between the two lies in that the substrate 100A does not have a patterned surface; instead, the light emitting diode chip 100A has a planar surface. Herein, the light emitting diode chip 100E serves as a control reference of the enhancement of the output powers of the light emitting diode chips 100C, 100D, wherein the parameter settings, the test method and enhancement calculation method can be referred to the previous embodiments, and descriptions thereof will be omitted hereinafter.

In the above embodiments, the microstructures are exemplified by protrusions; however, it should be understood that the above embodiments are presented by way of examples and not by way of limitation. Reference will now be made in detail to other embodiments of the application. Whenever possible, components that are the same as those of the previous embodiment are assigned with the same reference numerals, and descriptions thereof will be omitted hereinafter.

FIG. 12 is a schematic diagram of a light emitting diode chip of another exemplary embodiment of the disclosure. FIG. 13 is a partial top view diagram of a growth substrate in FIG. 12. Referring to both FIGS. 12 and 13, the light emitting diode chip 100F and the light emitting diode chip 100 are substantially the same; a major difference between the two lies in that the microstructures of the light emitting diode chip are depressions 117, wherein the depth DP of each depression is between 1 micron and 3 microns. In one exemplary embodiment, the depth DP is between 1.2 micron and 2 microns.

More particularly, each depression 117 has an opening 118 connected with the growth surface 111, wherein the opening 118 has a width W1. In this exemplary embodiment, each depression 117 has a plurality of sectional surfaces SEC2 (one of which is schematically depicted in FIG. 1) parallel to the growth surface 111, wherein the areas of these sectional surfaces SEC2 progressively decrease, for example, linearly decrease, along the depth direction. In this exemplary embodiment, each depression 117 has a triangular pyramid shape, for example; however, it should be understood that the shape of the depression 117 is presented by way of examples and not by way of limitation. In other exemplary embodiments, the depression 117 has other cone shape, which can be attuned according to the actual design requirements. On the other hand, the area of the growth surface 111 occupied by these depressions 117 is A1, while the area of the growth surface 111 not occupied by these depressions 117 is A2, wherein A1 and A2 satisfy the relation $0.1 \leq A2/(A1+A2) \leq 0.5$.

In this embodiment, the two neighboring openings 118 maintain a distance S1, and the sum of the width W1 and the distance S1 is a fixed value, ranging between 1 micron and 3 microns, wherein the sum of the width W and the distance S is substantially identical to the distance G between the centroids of two neighboring openings 118. Since the sum of the width W and the distance S is a fixed value, changes in the width W and the distance S affect the value of the filling ratio (which is A2/(A1+A2)). Alternatively speaking, when the width W increases, the distance S1 correspondingly decreases. Consequently, the area of the growth surface 111 occupied by the depressions 117 increases and the area of the growth surface 111 not occupied by the depressions 117 decreases to reduce the filling ratio. As the filling ratio decreases, the light emitted from the light emitting layer 122 is effectively scattered by these depressions 117; hence, the probability that a complete reflection occurring inside the light emitting diode chip 100 is reduced to thereby enhance the light extraction efficiency of the light emitting diode chip 100F.

In other exemplary embodiments, a surface treatment is performed on the surface of each depression 117 and the growth surface 111 to render the surface of each depression 117 and the growth surface 111 with an appropriate degree of roughness. In principle, the surface roughness of the surface of each protrusion 112 and the growth surface 111 does not exceed the roughness value of 10 nm. When the surface roughness of the surface of each protrusion 112 and the growth surface does not exceed 10 nm, the epitaxy quality of the light emitting diode element layer 120 is improved to ensure the light emitting efficiency of the light emitting diode chip 100.

Figure 14:
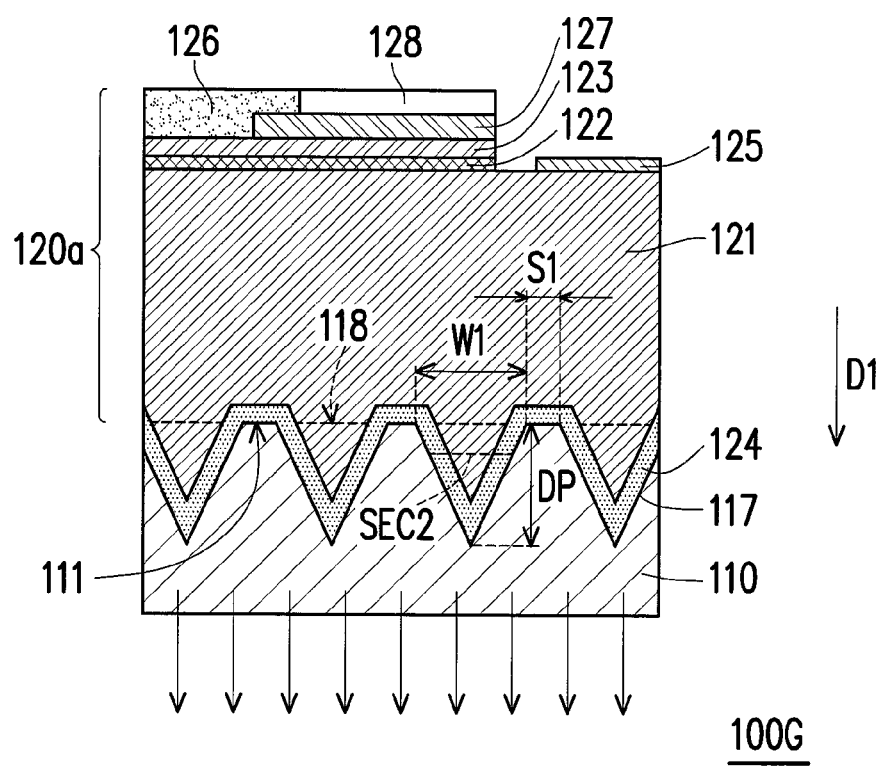
FIG. 14 is schematic diagram of a light emitting diode chip of another exemplary embodiment of the disclosure.

FIG. 14 is a schematic diagram of a light emitting diode chip according to another exemplary embodiment of the disclosure. Referring to FIG. 14, the light emitting diode chip 110G is, for example, a flip-chip light emitting diode chip, and it is substantially the same as the light emitting diode chip 100F. One major difference between the two lies in that the light emitted from the light emitting diode chip 100G to the outside is in a direction that passes through the substrate 110. In one exemplary embodiment, the light emitting diode element layer 120a further includes a reflective layer 128. The reflective layer 128 is disposed on the transparent conductive layer 127, and the transparent conductive layer 127 is positioned between the reflective layer 128 and the second conductivity type semiconductor layer 123. Generally speaking, the material of the reflective layer 128 may include silver, aluminum, or other metals with favorable reflective property. When the light emitted from the light emitting layer 122 is irradiated to the reflective layer 128, the light is reflected and transmitted toward the substrate 110.

According to the disclosure, the growth surface of the substrate of the light emitting diode chip has a plurality of microstructures thereon, wherein the ratio of the area of the growth surface not covered by these microstructures to the total area of the growth surface is between 0.1 and 0.5 (which is the filling ratio is between 10% and 50%). Accordingly, the light emitted from the light emitting layer is effectively scattered after being in contact with these microstructures to lower the probability of a total reflection occurring internally of the light emitting diode chip to thereby elevate the light extraction efficiency of the light emitting diode chip. Alternatively, when the filling ratio approaches 10%, the enhancement of the output power of the light emitting diode chip is even more apparent. As the heights of the protrusions increase, the enhancement of the output power of the light emitting diode chip correspondingly increases.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A light emitting diode chip comprising:
   a substrate, comprising a growth surface and a plurality of microstructures on the growth surface, wherein a first area of the growth surface occupied by the plurality of microstructures is A1 and a second area of the growth surface not occupied by the plurality of microstructures is A2, A1 and A2 satisfy the relation $0.1 \leq A2/(A1+A2) \leq 0.5$, and a surface roughness of a surface of each microstructure of the plurality of microstructures and the growth surface does not exceed 10 nanometers; and
   a light emitting diode element layer, disposed on the growth surface.

2. The light emitting diode chip of claim 1, wherein the plurality of microstructures comprises a plurality of protrusions.

3. The light emitting diode chip of claim 2, wherein a height of each protrusion of the plurality of protrusions is between 1 micron and 3 microns.

4. The light emitting diode chip of claim 2, wherein a height of each protrusion of the plurality of protrusions is between 1.2 micron and 2 microns.

5. The light emitting diode chip of claim 2, wherein each protrusion of the plurality of protrusions comprises a base connecting with the growth surface and the base has a width, and two neighboring bases maintain a distance therebetween, and a sum of the width and the distance is between 1 micron and 3 microns.

6. The light emitting diode chip of claim 5, wherein a distance between centroids of the two neighboring bases is between 1 micron and 3 microns.

7. The light emitting diode chip of claim 2, wherein each protrusion of the plurality of protrusions comprises a plurality of sectional surfaces parallel to the growth surface, and areas of the plurality of sectional surfaces progressively decrease along a height direction of each protrusion.

8. The light emitting diode chip of claim 7, wherein the areas of the plurality of sectional surfaces linearly decrease along the height direction of each protrusion.

9. The light emitting diode chip of claim 7, wherein the areas of the plurality of sectional surfaces decrease non-linearly along the direction of the height of each protrusion.

10. The light emitting diode chip of claim 1, wherein the plurality of microstructures comprises a plurality of depressions.

11. The light emitting diode chip of claim 10, wherein a depth of each depression of the plurality of depressions is between 1 micron and 3 microns.

12. The light emitting diode chip of claim 10, wherein a depth of each depression of the plurality of depressions is between 1.2 micron and 2 microns.

13. The light emitting diode chip of claim 10, each depression of the plurality of depressions comprises an opening connecting with the growth surface and the opening has a width, and two neighboring openings maintain a distance therebetween, and a sum of the width and the distance is between 1 micron and 3 microns.

14. The light emitting diode chip of claim 13, wherein a distance between centroids of the two neighboring openings is between 1 micron and 3 microns.

15. The light emitting diode chip of claim 10, wherein each depression of the plurality of depressions comprises a plurality of sectional surfaces parallel to the growth surface, and areas of the plurality of sectional surfaces progressively decrease along a depth direction of each depression.

16. The light emitting diode chip of claim 15, wherein the areas of the plurality of sectional surfaces linearly decrease along the depth direction of each depression.

17. The light emitting diode chip of claim 1, wherein the light emitting diode element layer further comprises:
   a first conductivity type semiconductor layer, disposed on the growth surface;
   a light emitting layer, disposed on the first conductivity type semiconductor layer; and
   a second conductivity type semiconductor layer, disposed on the light emitting layer.

18. The light emitting diode chip of claim 17, wherein the light emitting device layer further comprises:
   a buffer layer, disposed on the growth surface, the buffer layer is configured between the substrate and the first conductivity type semiconductor layer and encapsulating the plurality of protrusions.

19. The light emitting diode chip of claim 18, wherein a material of the buffer layer comprises aluminum nitride, gallium nitride, indium nitride, aluminum indium nitride, aluminum gallium nitride, aluminum gallium indium nitride, zirconium boride, or hafnium nitride.

20. The light emitting diode chip of claim 17, wherein one of the first conductivity type semiconductor layer and the second conductivity type semiconductor layer comprises a P-type semiconductor layer and another one of the first conductivity type semiconductor layer and the second conductivity type semiconductor layer comprises an N-type semiconductor layer.

21. The light emitting diode chip of claim 17, wherein the light emitting diode element layer further comprises:
   a first electrode, electrically connected with the first conductivity type semiconductor layer; and
   a second electrode, electrically connected with the second conductivity type semiconductor layer.

22. The light emitting diode chip of claim 21, wherein the light emitting diode element layer further comprises:
   a transparent conductive layer, disposed on the second conductivity type semiconductor layer, and the second electrode is electrically connected with the second conductivity type conductor layer through the transparent conductive layer.

23. The light emitting diode chip of claim 22, wherein the light emitting diode element layer further comprises:
   a reflective layer, disposed on the transparent conductive layer, and the transparent conductive layer is disposed between the reflective layer and the second conductivity type conductor layer.

24. The light emitting diode chip of claim 17, wherein the light emitting diode layer comprises a single quantum well structure or a multiple quantum well structure.

* * * * *